United States Patent
Anand et al.

(12)

(10) Patent No.: US 6,549,008 B1
(45) Date of Patent: Apr. 15, 2003

(54) STEADY-STATE IMAGING SEQUENCE

(75) Inventors: Christopher K. Anand, Chesterland, OH (US); Michael R. Thompson, Cleveland Heights, OH (US); Dee H. Wu, Shaker Heights, OH (US)

(73) Assignee: Koninklijke Philips Electronics, N.V., Eindhoven (NL)

( * ) Notice: Subject to any disclaimer, the term of this patent is extended or adjusted under 35 U.S.C. 154(b) by 162 days.

(21) Appl. No.: 09/712,402

(22) Filed: Nov. 14, 2000

(51) Int. Cl.$^7$ ................................................ G01V 3/00
(52) U.S. Cl. ........................................ 324/307; 324/309
(58) Field of Search ................................ 324/307, 309, 324/312, 314, 318, 322

(56) References Cited

U.S. PATENT DOCUMENTS

| 4,769,603 A |   | 9/1988 | Oppelt et al. | 324/309 |
| 5,034,692 A |   | 7/1991 | Laub et al. | 324/309 |
| 5,541,514 A |   | 7/1996 | Heid | 324/309 |
| 5,650,723 A | * | 7/1997 | Meyer | 324/307 |
| 5,668,474 A |   | 9/1997 | Heid | 324/309 |
| 5,810,726 A | * | 9/1998 | Van Vaals et al. | 324/309 |
| 6,281,681 B1 | * | 8/2001 | Cline et al. | 324/307 |

* cited by examiner

Primary Examiner—Louis Arana
(74) Attorney, Agent, or Firm—Fay, Sharpe, Fagan, Minnich & McKee, LLP

(57) ABSTRACT

A subject is disposed in an imaging region (10) of a magnetic resonance imaging apparatus. An operator designates a steady-state imaging sequence and a sequence controller (42) coordinates a gradient field controller (30) and an RF pulse controller (38) to generate the desired sequence. The gradient controller applies gradients that define a closed trajectory through k-space that starts at an origin point and follows a closed path to an end point. An analyzer (112) analyzes data sampled at the beginning and end points. A gradient offset processor (114) signals the sequence controller to apply additional gradients until the analyzer determines that the end point coincides with the origin point. A scaling circuit (84) scales data sampled between the origin and end points for various anomalies in the steady-state magnetization, reconstructing scaled data into at least one image representation.

21 Claims, 6 Drawing Sheets

STEADY-STATE IMAGING SEQUENCE

BACKGROUND OF THE INVENTION

The present invention relates to the diagnostic imaging arts. It finds particular application in conjunction with steady-state magnetic resonance imaging and will be described with particular reference thereto. It is to be appreciated that the present invention is also applicable to other types of diagnostic imaging and is not limited to the aforementioned applications.

In magnetic resonance imaging, a uniform main magnetic field is created through an examination region in which a subject to be examined is disposed. With open magnetic resonance systems, the main magnetic field is vertical, perpendicular to the subject. With classical bore systems, the main magnetic field is along the head to foot horizontal axis of a prone subject. A series of radio frequency (RF) pulses and magnetic field gradients are applied to the examination region to excite and manipulate magnetic resonances. Gradient magnetic fields are conventionally applied to encode spatial position and other information in the excited resonance.

In steady-state imaging, the repetition time is significantly shorter than the spin relaxation times. That is, the magnetic resonance signals induced by one RF pulse are recycled repeatedly in subsequent repetitions. Typically, an RF excite pulse tips selected dipoles into a transverse plane and decays to zero before application of the next RF pulse. In coherent steady-state imaging, a series of RF pulses are used to tip additional magnetization into the transverse plane and to manipulate previously tipped still decaying magnetization. After each RF pulse, resonance is sampled. Phase-encode gradients, are applied to the main magnetic field before and after each line is read to phase-encode the sampled data and remove the phase-encoding before the next RF pulse. Typically, the phase-encode gradients are stepped in discrete values. Read gradients are applied during readout to encode frequency. The resonance data is collected orderly along a series of linear data lines in k-space. This method of data collection is inefficient. The system reads a line, then rewinds back to zero and reads the next line, and so on. In this manner, the sampling trajectory traverses twice the width of k-space, for each data line sampled. The data matrix and k-space are filled in much like a typewriter filling a sheet of paper. The typewriter does not fill anything in while it is returning to the left margin, and typical steady-state MR imaging techniques do not read as they are rewinding and stepping the phase-encode gradient. This is inefficient because half of the time data is not being read. Further, this method requires high gradients, which strain the gradient amplifiers, and can cause the patient discomfort.

One application of steady-state imaging is imaging of the heart. In cardiac imaging, data is typically gathered over the time span of several cardiac cycles. The gathered data is temporally sorted, and grouped to form multiple images at different phases of the cardiac cycle. Encoding errors can accumulate over time, in particular, phase-encoding errors. These errors can accumulate over time, degrading image quality.

The present invention provides a new and improved method and apparatus that overcomes the above referenced problems and others.

SUMMARY OF THE INVENTION

In accordance with one aspect of the present invention, a method of magnetic resonance is provided. A subject is disposed in an imaging region and resonances are repeatedly tipped into a transverse plane to establish a steady state. Gradient pulses are applied to define sampling trajectories through a k-space that begin at a point and pass through that point again. The resonance signals are received, sampled, demodulated, and reconstructed.

According to another aspect of the present invention, a magnetic resonance apparatus is provided. A main magnet assembly generates a temporally constant main magnetic field in an imaging region. A gradient subsystem applies gradient pulses to the main magnetic field, defining a sampling trajectory through a k-space. The trajectory oversamples at least one point. An RF system excites resonance, a sampling circuit samples the resonance, an RF receiver receives the resonance, a processor analyzes the demodulated signals, and a reconstruction processor reconstructs the resonance into an image representation.

According to another aspect of the present invention, a method of steady-state magnetic resonance imaging is provided. A sampling trajectory is defined along a closed path having an origin point and an end point. Data is sampled along the path between the origin point and the end point. The data is reconstructed into an image representation. The data sampled at the origin point is compared to the data sampled at the end point.

One advantage of the present invention is that it utilizes efficient data collection scenarios.

Another advantage of the present invention is that it makes use of non-steady-state portions of the resonance data to make steady-state images.

Another advantage of the present invention is that it self corrects phase discrepancies.

Another advantage of the present invention resides in a reduced repetition time.

Another advantage of the present invention resides in gradient and dB/dt requirements.

Another advantage of the present invention resides in its suitability for sliding window reconstructions.

Another advantage of the present invention resides in fractional signal averaging.

Yet another advantage of the present invention resides in the ability to collect dual resolution data in a single sequence.

Still further benefits and advantages of the present invention will become apparent to those skilled in the art upon a reading and understanding of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENT

Figure 1:
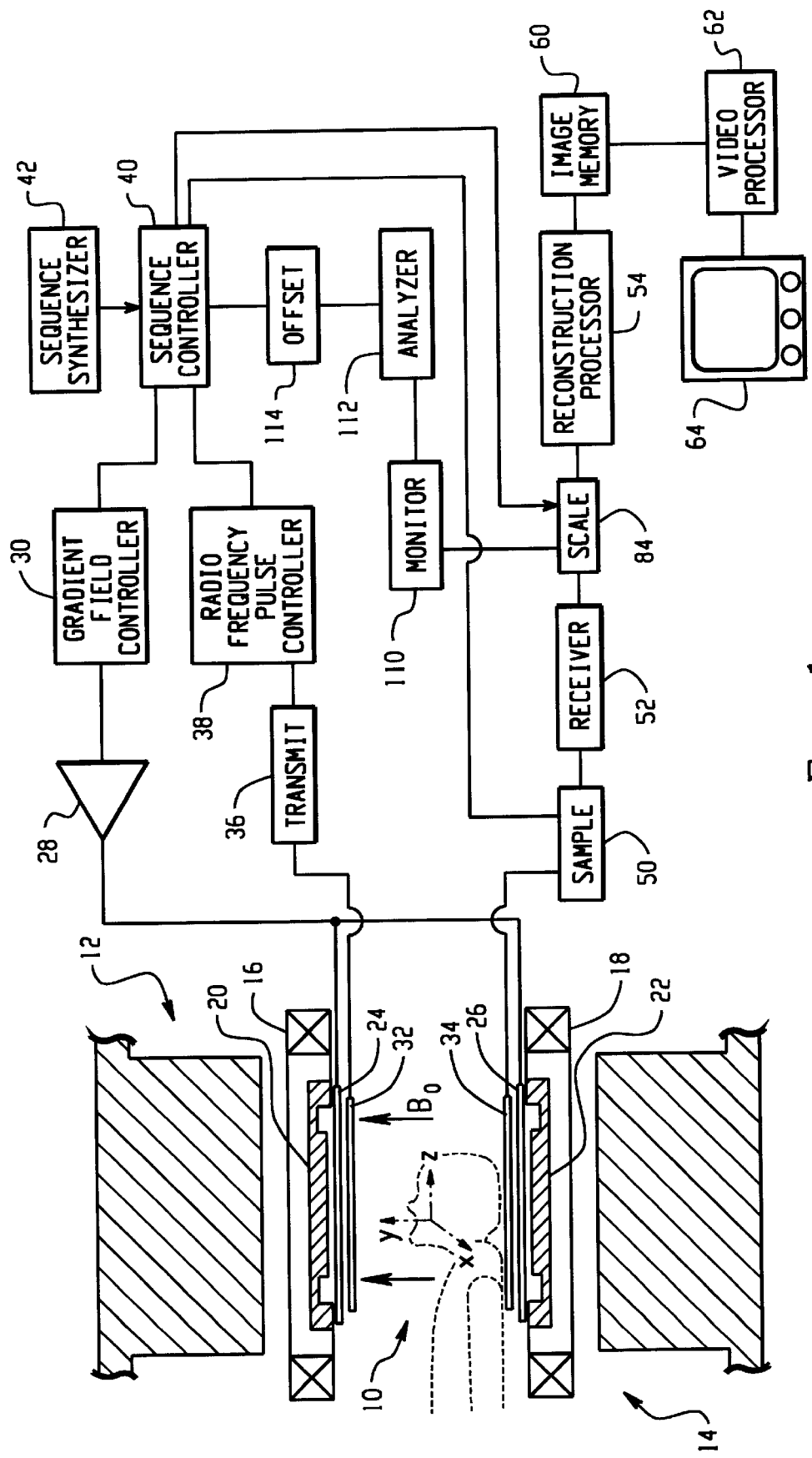
FIG. 1 is a diagrammatic illustration of an MRI apparatus in accordance with the present invention.

With reference to FIG. 1, in an MRI system, a subject is received in an imaging region 10. In an open type MRI, the imaging region is defined between an upper pole assembly 12 and a lower pole assembly 14. Although described with reference to an open MRI for purposes of illustration, it is to be appreciated that the present invention is also applicable to solenoid, or bore type MRI systems. A pair of annular super-conducting magnets 16, 18 surround upper and lower pole pieces 20, 22 generating a temporally constant, main magnetic field $B_o$ through the imaging region 10. It is to be appreciated that the open MRI apparatus may have a variety of pole pieces or, in some instances, no pole pieces at all. Optionally, a ferrous flux return path is provided between the pole assemblies remote from the imaging region 10.

For imaging, magnetic field gradient coils 24, 26 are disposed on opposite sides of the imaging region 10 adjacent the pole pieces 20, 22. In the preferred embodiment, the gradient coils are planar coil constructions which are connected by gradient amplifiers 28 to a gradient magnetic field controller 30. The gradient magnetic field controller 30 causes current pulses which are applied to the gradient coils such that gradient magnetic fields are superimposed on the temporally constant and uniform field $B_o$ across the imaging region 10. The gradient fields are typically generated along a longitudinal or y-axis, a vertical or z-axis and a transverse or x-axis.

In order to excite and manipulate magnetic resonance in selected dipoles of a subject disposed in the imaging region 10, radio frequency coils 32, 34 are disposed between the gradient coils 24, 26 and the imaging region 10. At least one radio frequency transmitter 36, preferably a digital transmitter, causes the radio frequency coils to transmit radio frequency pulses requested by a radio frequency pulse controller 38 to be transmitted into the imaging region 10. A sequence controller 40, under operator control, retrieves an imaging sequence from a sequence synthesizer 42. The sequence controller 40 provides the selected sequence information to the gradient controller 30 and the radio frequency pulse controller 38 such that radio frequency and gradient magnetic field pulses in accordance with the selected sequence are generated.

These RF pulses are used to induce and manipulate magnetic resonance in the subject. In order to produce an image, the resonance signals are detected by the RF coils 32, 34 and sampled by a sampling and digitizing circuit or hardware subsystem 50. The sampled resonance data is demodulated by one or more receivers 52, preferably digital receivers. The digitized demodulated signals or data lines are reconstructed by a reconstruction processor 54 into volumetric, slice, or other image representations. Preferably, a Fourier transform or other appropriate reconstruction algorithm is utilized. The image representations are stored in a volumetric image memory 60. A video processor 62, under operator control, withdraws selected image data from the volume memory and formats it into appropriate data for display on a human readable display 64, such as a video monitor, active matrix monitor, liquid crystal display, or the like.

Figure 2:
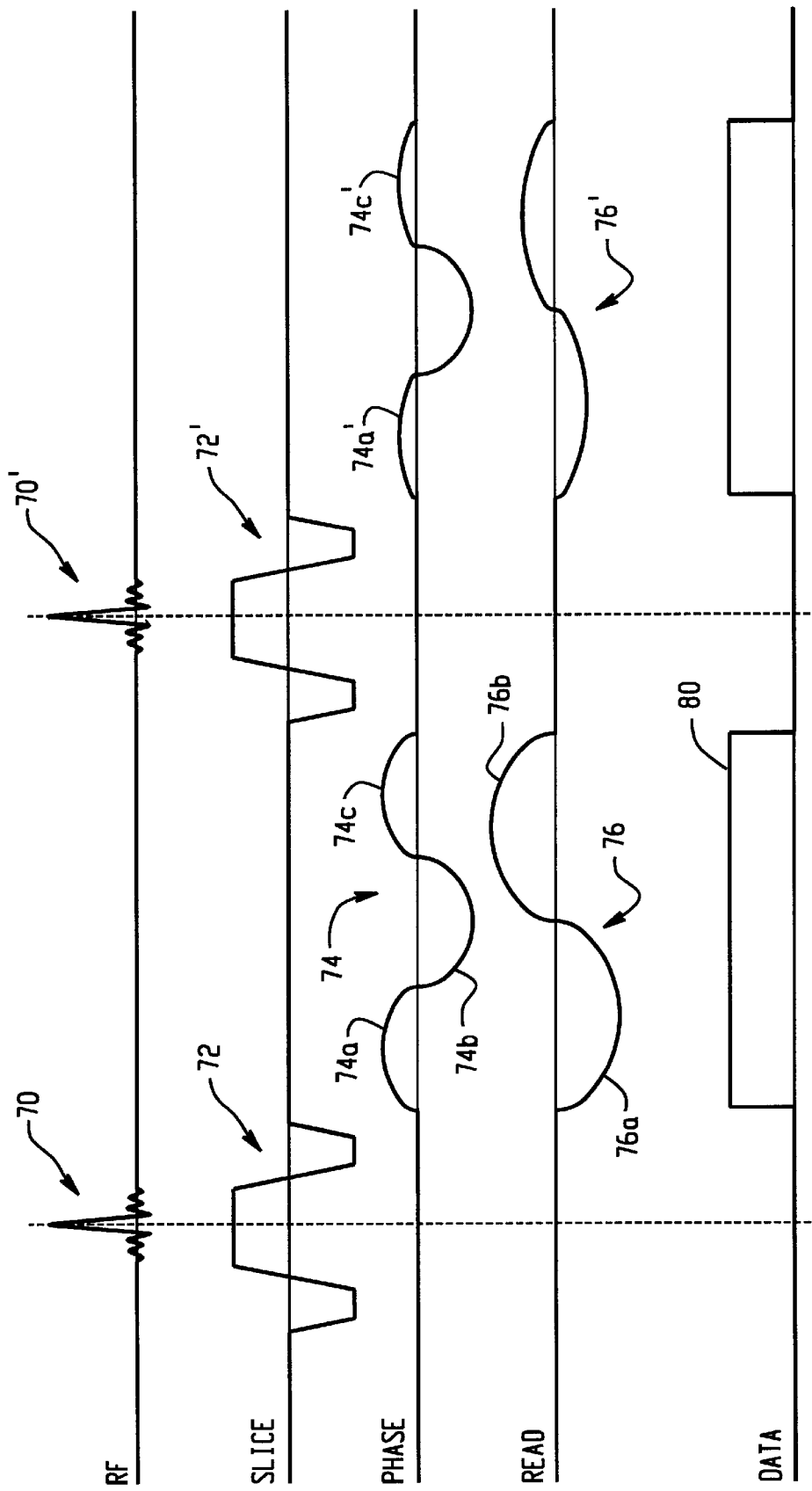
FIG. 2 is a diagnostic illustration of an imaging sequence which creates the trajectory of FIG. 3.

In one preferred embodiment, a pilot image of the region of interest is taken. An operator chooses a slice orientation, a resolution, a repeat time (TR), etc. with reference to pilot image. A steady-state sequence, such as the sequence of FIG. 2, is selected by the sequence synthesizer 42 based on the given operator information. The sequence is then submitted to the sequence controller, which takes a plurality of stabilization shots and imaging shots successively rotated according to the calculated number of intervals. The images are reconstructed by the reconstruction processor 54 and displayed 64 for the user.

Figure 3:
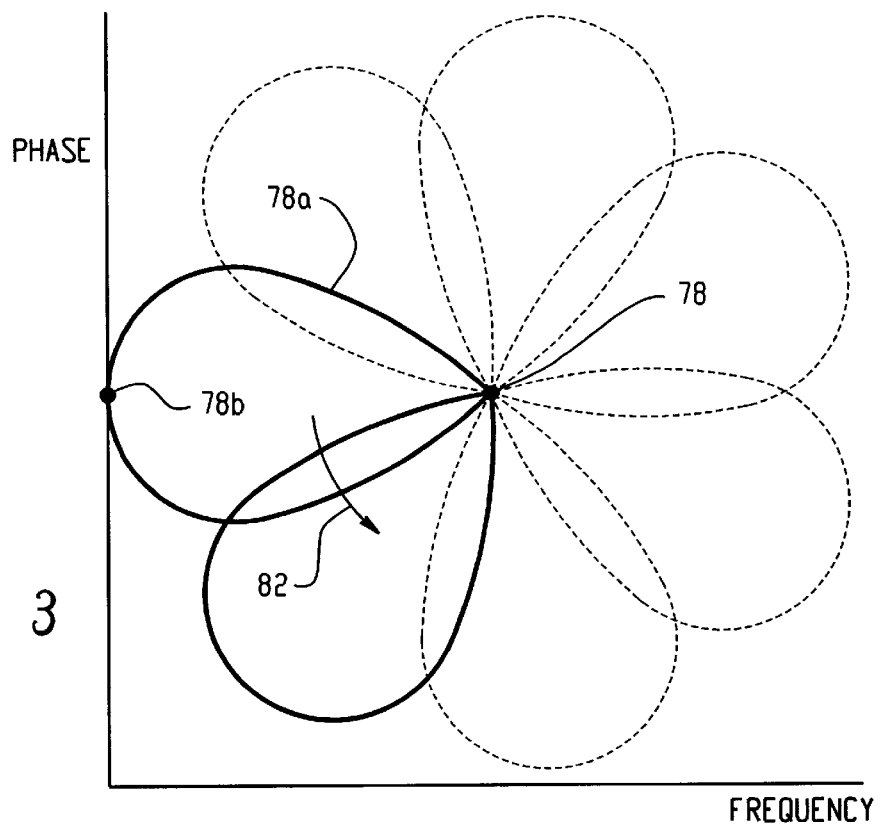
FIG. 3 is multiple legs of a k-space trajectory in accordance with the present invention.

With particular reference to FIGS. 2 and 3, one or more preliminary RF and slice select pulses (not shown) are applied to achieve a steady-state. Alternately, as described below, data can be collected as the magnetization is built to steady-state and scaled accordingly. Thereafter, the sequence controller 40 causes the radio frequency pulse controller 38 to apply a radio frequency pulse 70 of a preselected tip angle and concurrently causes the gradient field controller 30 to apply a slice select gradient pulse 72. Thereafter, the sequence controller causes the gradient field control to apply lobes of an oscillating phase-encode gradient 74 along one axis in the selected slice and a read gradient 76 along an orthogonal axis in the selected slice. At the beginning of pulses 74 and 76, the sampling trajectory is in a center 78 of k-space. With the phase-encode axis in the vertical direction and the read axis in the horizontal direction in FIG. 3, a positive-going initial lobe 74a causes the trajectory to move in a positive phase-encode direction, upward in FIG. 3. A negative-going initial lobe 76a of the read gradient concurrently causes the trajectory to move in a negative read direction 78a, to the left in FIG. 3. About a third of the way along the trajectory, a second phase-encode gradient lobe 74b in the negative direction causes the trajectory to move in the negative phase-encode direction, i.e., downward. At a mid-point 78b of the trajectory, the middle lobe of the phase-encode gradient 74b is at a maximum negative (steepest descent) and the read gradient is reversing sign to commence a positive lobe 76b, i.e., the trajectory starts to return towards the origin 78 of k-space. A positive-going third lobe 74c of the phase-encode gradient returns the trajectory upward towards the center 78 of k-space. Because the total area under lobes 74a and 74c is equal to the area under lobe 74b and because the area under lobe 76a is equal to the area under lobe 76b, the trajectory returns to its starting point, the center of k-space. The sequence controller further sends an enable pulse 80 to the sampling subsystem 50 such that resonance data is sampled along the entire trajectory. Optionally, data is sampled along most of lobe 76a to create one data line and along a complimentary portion of lobe 76b to form a second data line. However, greater efficiency is achieved if sampling is conducted along the entire trajectory.

In the next repetition of the sequence, an RF pulse of like tip angle 70' is applied in the presence of a slice select gradient 72' for the same slice. A first lobe 74a' of the phase-encode gradient is slightly lower than the first lobe of the preceding repetition and a last lobe 74c' is slightly higher. Both lobes of a read gradient 76' are slightly lower. This rotates the loop or teardrop trajectory as illustrated by trajectory 82 in FIG. 3. This process of stepping the phase-encode and read gradients is repeated in subsequent repetitions to rotate the trajectory fully around the center of k-space.

If the image reconstructed from the sampled data is not to the operator's liking, the operator can adjust various system parameters to improve it. For example, the operator can adjust the repeat time, i.e., the time between RF pulses 70 and 70' and repeat the sequence. Similarly, the operator can adjust the slice select gradient pulses to select a narrower or wider slice or to shift the slice. The steps between loops of the trajectory can be made relatively small for good image resolution or relative large for fast imaging. As another alternative, the steps between loops of the trajectory can be relatively large for fast imaging, but can be shifted to fall mid-way between trajectory loops of the first rotation around k-space. By reconstructing both loops together as a single data set, image resolution is improved. By offsetting the trajectory loops yet again, the resolution and quality of the resultant image can be progressively improved. In this manner, the operator can conduct a quick scan to locate the precise region of interest and then allow the sequence to build to a progressively higher resolution image for diagnostic purposes.

In steady-state imaging, a plurality of preliminary echoes are typically applied to build the magnetization to the steady-state level. The approach to steady-state varies from tissue to tissue and is difficult to predict. However, it is possible to correct for the approach to steady-state by repeatedly measuring the center of k-space to determine the overall magnitude and phase modulation. To this end, a scaling circuit 84 is provided which scales the output of the first several trajectories before the magnetic resonance has reached the steady-state level. Sampling the intensity of the data points at the beginning and end of each closed-loop trajectory provides a double check on the rate at which the steady-state magnetization is building.

Moreover, each time an RF pulse 70 is applied, there is an increase in the magnetization which decays back to the steady-state level. Again, the magnitude and duration of this magnetization increase is predictable from a priori information and prior measurements. The scaling circuit 84 again scales the data line collected along the first portion of the trajectory accordingly. This enables data to be collected immediately after the first RF pulse and eliminates the traditional delay while the magnetization returns substantially to the steady-state level.

In another preferred embodiment, a plurality of images are reconstructed and saved to the image memory 60 at regular intervals. These images are displayed in a ciné mode, like a movie, in real-time or for later to record and display time evolution of the anatomy.

Figure 4:
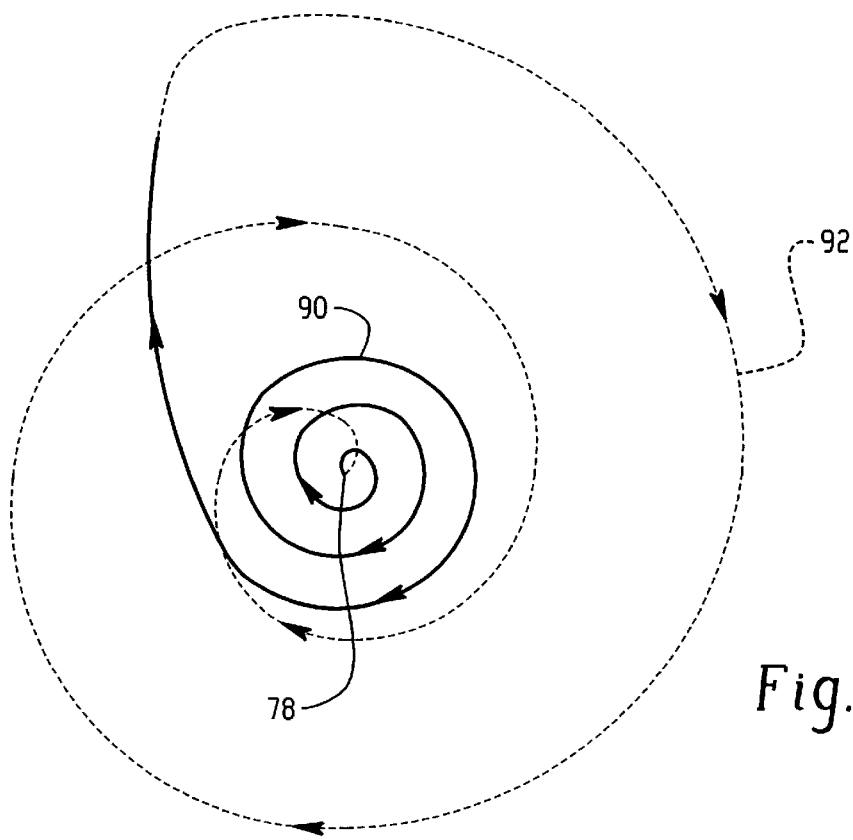
FIG. 4 is a dual-resolution path through k-space, in accordance with the present invention.

Numerous other closed trajectories are also contemplated. In the embodiment of FIG. 4, the trajectory provides for dual resolutions. More specifically, after a plurality of stabilization shots, each imaging shot is followed by oscillation phase and read gradients, which using the principles discussed above, first cause the trajectory to move in a dense sampling pattern 90 which samples a large number of points of k-space at close intervals for high resolution. The gradient amplitudes are then increased and the periodicity decreased to create a low resolution portion 92 which samples outer ranges of k-space with a lower sampling density. The phase and read gradients are again balanced to return the trajectory to the center of k-space 78. After each RF pulse, the gradient waveforms are indexed to rotate the illustrated trajectory a few degrees. Pilot images can be generated from the higher resolution portion of the trajectory 90 at short, temporal intervals.

In another embodiment, data collection is gated in accordance with anatomical movement, such as the cardiac cycle, breathing, or the like. Because this is a steady-state procedure, the RF pulses 70, 70' continue to be applied at fixed intervals. The phase and read gradients are applied and indexed only within a preselected temporal window following an anatomically-based trigger. Gating can be conducted with sequences such as illustrated in FIG. 3, or dual-resolution sequences such as illustrated in FIG. 4. The dual-resolution sequence of FIG. 4 is advantageous in that data near the center of k-space can be coordinated with the triggering while data from the periphery of k-space is more temporally displaced from the triggering event.

In another preferred embodiment, a mode of operation is selected having dual-resolution, operator interaction, and operator chosen retrospective gating. This embodiment is the same as the embodiment discussed containing dual resolution, and operator interaction, but the user chooses the views from which the high-resolution image is constructed. After a predetermined number of views (e.g., five times the number of views necessary to reconstruct the high resolution image), the operator is presented with a series of low-resolution images and/or a moving low-resolution image. From this image, the operator selects time intervals, as represented by a contiguous series of images, as admissible, and the reconstruction processor 54 uses all views acquired during these time intervals to reconstruct the image. In the case of multiple admissible views acquired at the same rotation, an average is taken. Rotations with no representative admissible views can be synthesized using two-dimensional phase conjugate symmetry.

In another preferred embodiment, the a mode of operation is selected with dual-resolution, operator interaction, and image-based gating. This embodiment functions as does the embodiment with dual resolution, and operator interaction, but at the point at which the operator could choose to select a high resolution image the operator instead selects a high resolution image during the desired physical phase (e.g., cardiac diastole). The operator selects a percentage of the cycle to image. The reconstruction processor 54 continues to collect views and reconstruct low resolution images. The reconstruction processor 54 compiles image statistics to determine which low resolution images are more or less like the selected image. The low resolution images closest to the selected image are marked as admissible and a high resolution image is reconstructed as above.

In another preferred embodiment, a mode of operation is selected having dual-resolution, operator interaction, and image correction. This embodiment is the same as the previously discussed embodiment containing dual resolution, and operator interaction, but the low resolution images are used to determine parameters of a motion model of the subject which is used to correct the views before reconstructing the high resolution image.

In another preferred embodiment, a mode of operation is selected having dual-resolution, operator interaction, image correction, and image-based gating. This embodiment is similar tho the last previously discussed preferred embodiment, except the low resolution images are used to determine parameters of a motion model of the subject which is used to correct the admissible views before reconstructing the high resolution image.

In another preferred embodiment, a mode of operation is selected having dual-resolution, operator interaction, image correction, and prospective image-based gating. This mode is the same as the last previously discussed mode, excepting that the motion model is used both to determine which views to acquire and correct the admissible views before reconstructing the high resolution image.

Figure 5:
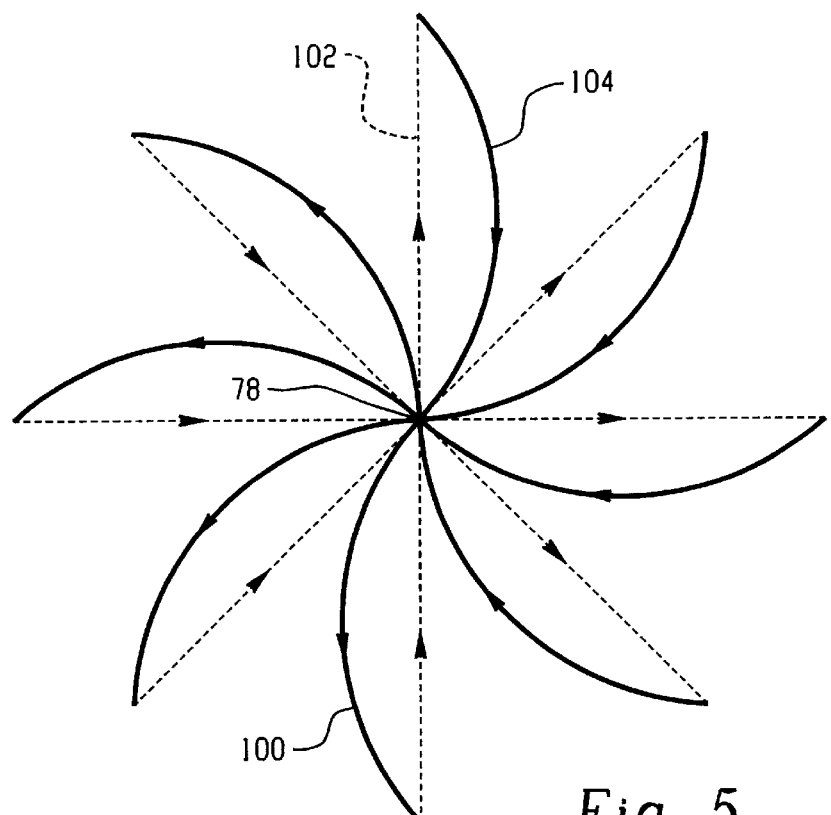
FIG. 5 is an alternate path through k-space.
Figure 6:
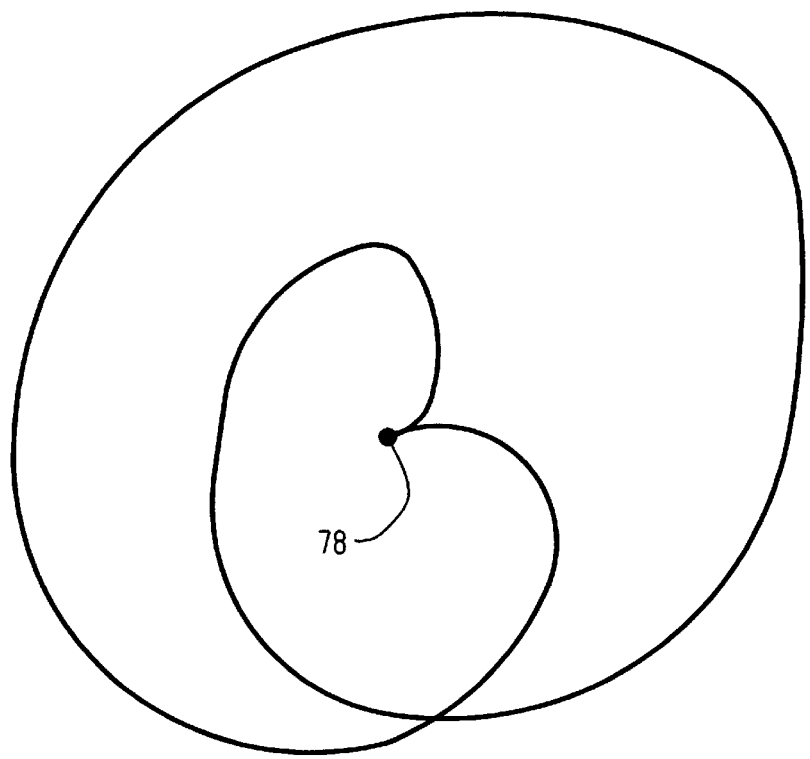
FIG. 6 is another alternate path through k-space.

Various other trajectories are also contemplated. With reference to FIG. 5, phase and read gradients as illustrated in FIG. 2 are applied. However, at the center point of the trajectory, a 180° RF pulse is applied to flip the trajectory (as shown in phantom) 180° around the center of k-space. That is, the trajectory leaves the center of k-space along a teardrop-shaped loop segment 100. At its mid-point, the 180° RF pulse flips the magnetization causing the trajectory to jump along path 102 to a diametrically opposite point in k-space. The phase-encode and read gradients move the trajectory along the second path 104 of the teardrop trajectory back to the center of k-space 78. The teardrop is indexed as discussed above to create a plurality of curved data lines. In this embodiment, each half of the trajectory 100, 104 is preferably treated as a separate data line for reconstruction purposes. In this embodiment, data can be separated into two subsets, data taken from outbound paths 100 and data taken from inbound paths 104. Two different images can be reconstructed from the subsets of the same region, the images having different contrasts. Various other trajectories, such as the double-loop trajectory of FIG. 6, are also contemplated.

Figure 7:
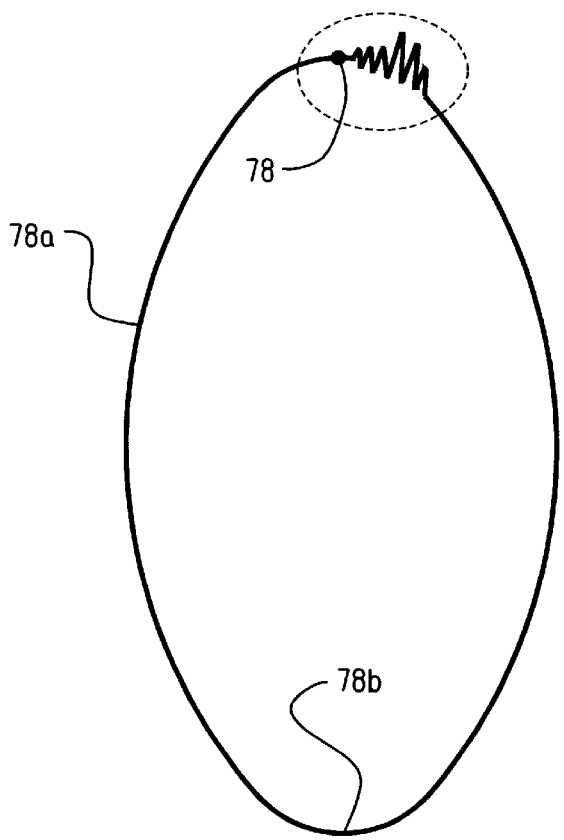
FIG. 7 is an illustration of a correction that occurs if a sampling path does not return to its origin.

With reference again to FIG. 1, it will be noted that each of the above-discussed trajectories is designed to return to the center of k-space. It will noted that if the trajectory fails to return to the center of k-space, then there will be residual encoding in one or both of the phase and frequency encode directions. When the next RF pulse is applied, the newly tipped-down resonance will be at the center of k-space, but the data which was previously tipped-down will be at the point in k-space at which the preceding trajectory ended. Thus, in the next sequence, the two portions of the magnetization will follow offset trajectories through k-space causing errors in the resultant data and artifacts in the resultant image. A k-space monitor 110 monitors the data point at the beginning and end of each trajectory. A data analyzer 112 analyzes the data taken at the beginning and end of each data point to determine whether the trajectory indeed returned to its starting point at the center of k-space. For example, the intensity of the sampled data point at the beginning and end of the trajectory should match. If the analyzer circuit 112 detects a difference, an offset circuit 114 causes the sequence controller 40 to add small gradient offsets in the phase or read direction, as may be appropriate to return to the center of k-space 78, as illustrated in FIG. 7. In a preferred embodiment, the data sampling window is held open to generate additional data points at the center of k-space, which data points are monitored by the monitor 110, but are not used by the image reconstruction processor 54. The offset circuit 114 iteratively adjusts the added phase and read gradient component until the analyzer circuit 112 determines that the ending intensity matches the starting intensity. Because the signal at the center of k-space is typically the strongest, various known signal maximization adjustment techniques or algorithms can be utilized. Preferably, once the necessary offset to return to the center of k-space is determined, the sequence controller adjusts the phase and read gradient magnitudes of the next repetition.

Although this technique has been described in two dimensions, it is to be appreciated that this technique is also applicable to three-dimensional imaging. The slice select gradient can be corrected analogously. Similarly, this technique is useable with three-dimensional imaging in which a second phase-encode gradient is applied along the third orthogonal axis (previously the slice select axis) for three-dimensional encoding.

Figure 8A:
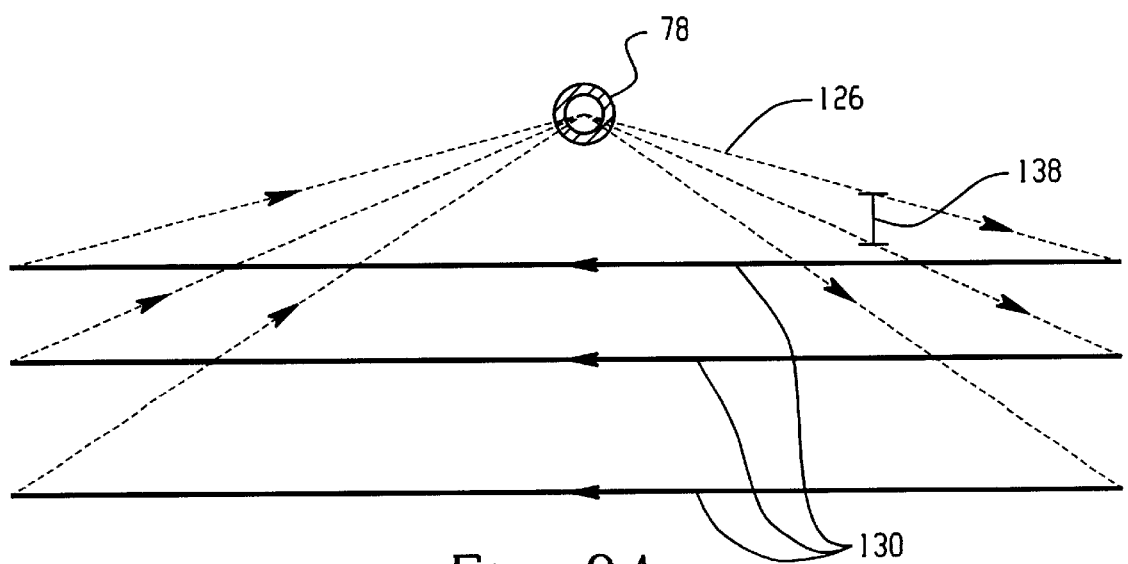
FIG. 8A is yet another alternate path through k-space.
Figure 8B:
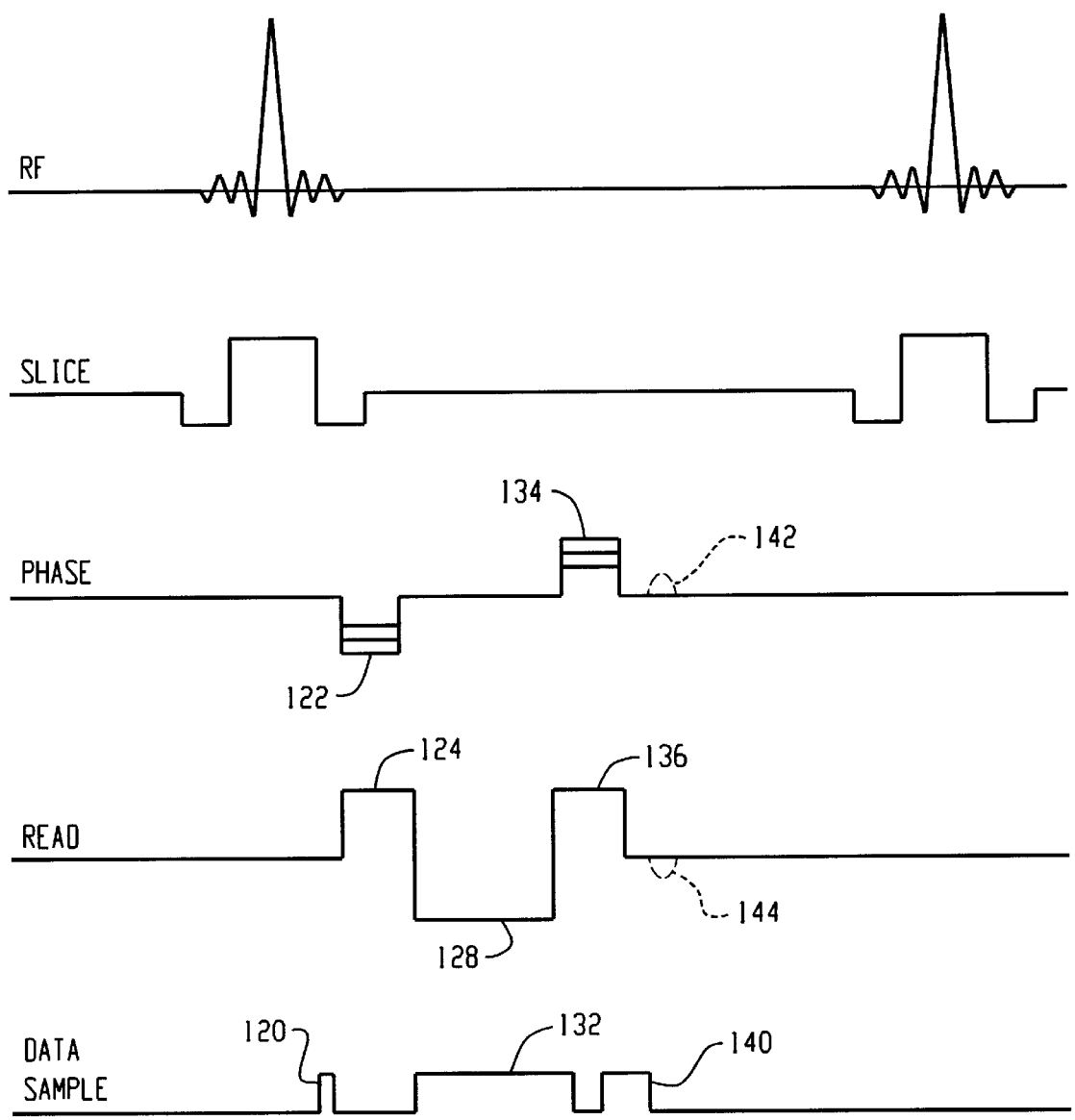
FIG. 8B is a diagnostic illustration of an imaging sequence which creates the trajectory of FIG. 8A.

With reference to FIGS. 8A and 8B, a data sampling pulse 120 is applied to read the intensity of the resonance at the center of k-space 78. Thereafter, a phase-encode gradient pulse 122 and a read gradient pulse 124 are applied to move the trajectory along leg 126. The phase-encode gradient is turned off and a read gradient pulse 128 causes the trajectory to move along path 130. As the trajectory moves along path 130, a data sampling pulse 132 causes the resonance to be sampled. At the end of the sampling period, a phase gradient pulse 134 which is equal and opposite to pulse 122 is applied concurrently with a read gradient pulse 136 to return the trajectory along leg 138 to the center of k-space. When the phase gradient 134 and the read gradient 136 are turned off, a data sampling pulse 140 causes the data at the end of the trajectory to be read out. If the analyzer 112 determines that the trajectory has not returned to the center of k-space, the offset circuit 114 applies small gradient pulses 142, 144 in the phase and read direction, as might be necessary, to return to the center of k-space. In subsequent repetitions, the magnitude of the phase-encode gradient is stepped to move the portion of the trajectory along which data is taken in parallel paths up and down.

The invention has been described with reference to the preferred embodiment. Modifications and alterations will occur to others upon a reading and understanding of the preceding detailed description. It is intended that the invention be construed as including all such modifications and alterations insofar as they come within the scope of the appended claims or the equivalents thereof.

Having thus described the preferred embodiments, the invention is now claimed to be:

1. A method of magnetic resonance imaging comprising:
    disposing a subject in an imaging region;
    repeatedly tipping magnetic resonance into a transverse plane to establish a coherent steady-state;
    applying positive and negative gradient pulses in which the area under the negative pulses balances the area under the positive pulses to define a closed sampling trajectory through a k-space starting at an origin point, the sampling trajectory returning to the origin point;
    applying balanced read gradient pulses to induce field echoes;
    sampling and demodulating the field echoes along at least a portion of the trajectory;
    reconstructing an image representation from the demodulated signals.

2. The method as set forth in claim 1, further including:
    monitoring demodulated signals sampled at the origin point.

3. The method as set forth in claim 2, further including:
    analyzing the demodulated signals sampled at the beginning and the end of each sampling trajectory to determine whether the trajectory actually returned to the origin point.

4. The method as set forth in claim 3 wherein:
    the applied gradient includes phase and frequency encode gradients and further including:
        in response to determining that the intensity has not returned to the origin point, applying at least one of additional phase and read encode gradients;
        continuing to sample demodulated signals as the additional gradients are applied;
        continuing to analyze the sampled signals for a return to the origin point; and
        in response to the trajectory returning to the origin point, stopping applying of the additional gradients.

5. The method as set forth in claim 1, wherein the origin point is at a center of k-space and wherein the gradient pulse applying step includes:

applying oscillating gradient pulses along at least two orthogonal axes such that the sampling trajectory traverses a closed-loop;

rotating subsequent trajectories about the center of k-space.

6. The method as set forth in claim 1, further including:

applying a 180° RF pulse during the applying of gradient pulses to flip the trajectory about the origin point.

7. The method as set forth in claim 1, wherein the gradient pulse applying and sampling steps include:

sampling magnetic resonance prior to application of the gradients;

terminating data sampling and applying gradients to move the trajectory to a preselected point in k-space;

concurrently applying at least a read gradient and sampling the resonance signals;

terminating data sampling and applying gradient pulses to return the trajectory to the origin point;

sampling resonance signals at the end of applying the gradient pulses, sampling at least one additional data point;

reconstructing the demodulated signals sampled during the read gradient into an image representation;

comparing the data point sampled before application of the gradient pulses with the data point sampled at the end of the gradient pulses.

8. The method as set forth in claim 7, further including:

in response to the comparing step, failing to indicate a failure of the trajectory to return to the origin point, continuing to sample data points, applying additional gradient pulses until a comparison of the continued sampled data points and the data points sampled prior to application of the gradient pulses indicate that the trajectory has returned to the origin point.

9. The method as set forth in claim 8, further including scaling the demodulated signals collected during the read gradient in accordance with a comparing step.

10. The method as set forth in claim 1, further including:

scaling the demodulated signals in accordance with variations in an amount of resonance tipped into a transverse plane.

11. The method as set forth in claim 1, further including:

monitoring demodulated signals sampled at the origin point at the beginning of each trajectory;

comparing the demodulated signals sampled at the beginning and end of each trajectory;

scaling signals sampled along the trajectory in accordance with the comparison.

12. The method as set forth in claim 1 wherein in the gradient pulse applying step, at most a maximum slew rate is experienced along one imaging axis at a time.

13. A method of magnetic resonance including:

disposing a subject in an imaging region;

repeatedly tipping magnetic resonance into a transverse plane to establish a steady-state;

applying gradient pulses that define a closed sampling trajectory through a k-space starting at an origin point, the sampling trajectory returning to the origin point;

sampling and demodulating signals from the magnetic resonance along at least a portion of the trajectory;

monitoring demodulated signals sampled at the origin point;

analyzing the demodulated signals sampled at the beginning and the end of each sampling trajectory to determine whether the trajectory actually returned to the origin point;

in response to determining that the trajectory failed to return to the origin point, applying additional gradient pulses that return the trajectory to the origin point;

reconstructing an image representation from the demodulated signals.

14. A method of magnetic resonance imaging comprising:

disposing a subject in an imaging region;

repeatedly tipping magnetic resonance into a transverse plane to establish a steady-state;

applying oscillating gradient pulses along at least two axes which cause the trajectory to sample k-space densely around the origin point and less densely away from the origin point, the sampling trajectory returning to the origin point;

demodulating resonance signals from the magnetic resonance along at least the more and less densely sampled regions of k-space;

reconstructing data sampled along the more densely sampled region of k-space into a first image representation and data collected along less densely sampled region of k-space into a second image representation.

15. A magnetic resonance apparatus comprising:

a magnet assembly which generates a temporally constant main magnetic field through an examination region;

a gradient coil subsystem that applies gradient pulses to the examination region, the pulses defining a sampling trajectory through k-space, the trajectory oversampling at least one point;

an RF subsystem which repeatedly tips magnetic resonance into a transverse plane and establishes a coherent steady-state in dipoles of a subject disposed in the examination region;

a sampling circuit which samples magnetic resonance in the examination region;

at least one radio frequency receiver for demodulating the sampled resonance signals;

a processor which receives and analyzes the demodulated signals corresponding to the oversampled point for differences therebetween;

a reconstruction processor which reconstructs the demodulated resonance signals into an image representation.

16. The magnetic resonance apparatus as set forth in claim 15, further including:

a sequence controller that controls the gradient coil subsystem and the RF subsystem such that the trajectory sequence through k-space is a closed path that starts at the oversampled point and is projected to end at the oversampled point.

17. The magnetic resonance apparatus as set forth in claim 15, further including:

a scaling circuit for scaling the sampled and demodulated resonance signals for variations in steady-state resonance, the reconstruction processor reconstructing the scaled demodulated resonance signals.

18. A magnetic resonance apparatus comprising:

a magnet assembly which generates a temporally constant main magnetic field through an examination region;

a gradient coil subsystem that applies gradient pulses to the examination region, the pulses defining a sampling trajectory through k-space, the trajectory oversampling at least one point;

an RF subsystem which excites resonance in dipoles of a subject disposed in the examination region;

a sequence controller that controls the gradient coil subsystem and the RF subsystem such that the trajectory sequence through k-space is a closed path that starts at the oversampled point and is projected to end at the oversampled point;

at least one radio frequency receiver for demodulating sampled resonance signals;

a processor which receives and analyzes the demodulated signals corresponding to the oversampled point for differences therebetween, the processor signalling which signals the sequence controller in response to the analysis of the oversampled points to control the gradient coil subsystem to apply additional gradient pulses until the trajectory returns to and ends at the oversampled point;

a reconstruction processor which reconstructs the demodulated resonance signals into an image representation.

19. A method of steady-state magnetic resonance imaging, the method comprising:

defining a sampling trajectory which starts at an origin point and continues along a closed path to an end point;

sampling data along the trajectory at the origin point, the end point, and at least one section of the trajectory;

reconstructing the data sampled along the section of the trajectory into an image representation;

comparing the data sampled at the origin point with the data sampled at the end point.

20. A method of steady state magnetic resonance imaging comprising:

applying gradients that define a sampling trajectory which starts at an origin point and continues along a closed path to an end point;

sampling data along the trajectory at the origin point, approaching the end point, and at least one section of the trajectory;

comparing the data sampled at the origin point with the data sampled at the end point;

continuing to apply gradients and sample until the end point coincides with the origin;

reconstructing the data sampled along the section of the trajectory into an image representation.

21. The method as set forth in claim 20 wherein while applying the gradients, a maximum slew is experienced along at most one imaging axis at a time.

* * * * *